US007099483B2

(12) United States Patent
Inagaki

(10) Patent No.: US 7,099,483 B2

(45) Date of Patent: Aug. 29, 2006

(54) SOUND CONTROL SYSTEM, SOUND CONTROL DEVICE, ELECTRONIC DEVICE, AND METHOD FOR CONTROLLING SOUND

(75) Inventor: Kazuya Inagaki, Kanagawa-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 21 days.

(21) Appl. No.: 10/767,113

(22) Filed: Jan. 28, 2004

(65) Prior Publication Data

US 2004/0184619 A1 Sep. 23, 2004

(30) Foreign Application Priority Data

Feb. 24, 2003 (JP) ............................ 2003-045879

(51) Int. Cl.

*H04B 3/00* (2006.01)
*H04B 5/00* (2006.01)
*H04R 27/00* (2006.01)
*H04R 29/00* (2006.01)
*H04R 5/00* (2006.01)
*H02B 1/00* (2006.01)
*H03G 5/00* (2006.01)

(52) U.S. Cl. ............................ 381/77; 381/79; 381/80; 381/85; 381/123; 381/58; 381/59; 381/103; 381/300

(58) Field of Classification Search ................ 381/307, 381/103, 123, 77, 58–59

See application file for complete search history.

(56) References Cited

U.S. PATENT DOCUMENTS

| | | | | |
|---|---|---|---|---|
| 6,466,832 | B1 | 10/2002 | Zuqert et al. | 381/77 |
| 6,741,708 | B1 * | 5/2004 | Nakatsugawa | 381/79 |
| 2001/0016046 | A1 * | 8/2001 | Ohta | 381/98 |
| 2004/0234088 | A1 * | 11/2004 | McCarty et al. | 381/306 |

* cited by examiner

*Primary Examiner*—Laura A. Grier

(74) *Attorney, Agent, or Firm*—Beyer, Weaver & Thomas

(57) ABSTRACT

A sound control system includes a plurality of electronic devices connected to a communication network, each of the electronic devices being capable of independently producing sound from connected speakers, and a sound control device transmitting control signals for controlling the electronic devices and audio signals to the electronic devices via the communication network. Each electronic device includes receiving means for receiving the control signals and the audio signals via the communication network, and selecting means for switching from other external signals to the audio signals in response to the control signals in order to drive the speakers by only the audio signals output to the speakers.

6 Claims, 3 Drawing Sheets

SOUND CONTROL SYSTEM, SOUND CONTROL DEVICE, ELECTRONIC DEVICE, AND METHOD FOR CONTROLLING SOUND

BACKGROUND OF THE INVENTION

1. Field of the Invention

The present invention relates to a sound control system, a sound control device, electronic devices which can produce sound providing a surround effect from their speakers, such as radios, and a method for controlling sound.

2. Description of the Related Art

As is well known, to obtain presence in sound in home theater systems, there are a variety of surround sound systems in which a plurality of speakers are connected to a video display device, such as a TV set. Such surround sound systems include the 5.1 channel surround system having a main control unit, five speakers, and one speaker handling low frequencies, known as a sub-woofer. In this 5.1 channel surround system, for example, three speakers and one sub-woofer are separately arranged in front of a listener and two speakers are placed in the rear to provide the most suitable surround sound to the listener.

On the other hand, wireless audio systems that can be placed at any location by users without limitations are also known (refer to, for example, Japanese Unexamined Patent Application Publication No. 2001-359200, in particular, paragraphs 0011 to 0081 and FIGS. 1 to 16). This wireless audio system, for example, has wireless channels between a main unit and dedicated speaker units. Audio data are transmitted between the main unit and the dedicated speaker units through the wireless channels. Thus, wherever the speaker units are placed, a variety of data including volume control data can be easily transmitted to control the speaker units. As a result, when the speaker units are relocated, the burden on the end user is decreased and the speaker units can be more flexibly placed.

This known surround system requires a plurality of dedicated speakers to be placed in a listening room. To provide sounds having a superior surround effect to a listener, these speakers are preferably placed at the corners of the room. The positions are, however, limited due to the connections to the main unit of the surround system. In addition, the plurality of dedicated speakers disadvantageously require their own floor space. In particular, the dedicated speakers cannot be used for other purposes while not used for the surround system. Thus, these speakers are costly due to their limited use.

Additionally, in the audio system disclosed in the above-described Japanese Unexamined Patent Application Publication No. 2001-359200, the main unit and the dedicated speaker units are connected to each other via wireless channels. This allows the speaker units to be placed at desired positions within relatively large ranges. However, like the above-described surround system, the speakers cannot be used for other purposes, thus being costly.

SUMMARY OF THE INVENTION

Accordingly, it is an object of the present invention to provide a sound control system, a sound control device, an electronic device, and a method for controlling the sound that can easily and cost-effectively provide a superior surround sound effect without using dedicated speakers.

To achieve the above-described object, a sound control system according to the present invention includes a plurality of electronic devices connected to a communication network, each of the electronic devices is capable of independently producing sound from connected speakers, and a sound control device identifying the electronic devices. The sound control device transmits control signals for controlling the electronic devices and audio signals corresponding the speakers of the electronic devices. Each electronic device includes receiving means for receiving the control signals and the audio signals via the communication network and selecting means for switching from other external signals to the audio signals in response to the control signals in order to drive the speakers by only the audio signals output to the speakers.

Preferably, in the above-described sound control system, the audio signals include surround sound signals.

A sound control device according to the present invention includes transmitting means connected via a communication network to a plurality of electronic devices capable of independently producing sounds from connected speakers. The transmitting means is capable of identifying the electronic devices and transmitting control signals for controlling the electronic devices and audio signals corresponding to the speakers to the electronic devices. The control signals includes at least signals for switching from other external signals to the audio signals in order to drive the speakers by only the audio signals output to the speakers.

An electronic device according to the present invention is capable of independently producing sounds from connected speakers and includes receiving means being capable of connecting a communication network and receiving control signals and audio signals via the communication network and selecting means for switching from other external signals to the audio signals in response to the control signals in order to drive the speakers by only the audio signals output to the speakers.

In a sound control system, a sound control device, and electronic devices according to the present invention, the sound control device identifies the electronic devices via a communication network, thus being capable of transmitting control signals and audio signals to a specific electronic device. Additionally, since each electronic device has receiving means and selecting means, the sound control device can control the audio signals to the speakers of the electronic devices by the control signals. Furthermore, since each electronic device can independently produce sounds from the connected speakers, the device itself, for example, a radio, can produce sound without depending on the sound control device. That is, each device functions as a stand-alone device and a member of the sound control system.

In fact, the sound control device enables sounds to emanate from the speakers of the devices, such as radios and TV sets, which can produce sound independently. In particular, if the audio signal is a surround signal, the sound control device can direct the devices to produce surround sound. Accordingly, unlike known surround systems, dedicated speakers, which cannot be used for other purposes, are not necessary. The speakers are usually used for a TV set and radios and can be used for providing surround sound when necessary. By removing the need for dedicated speakers, the entire system becomes low-cost and the electronic devices can be effectively and versatilely used. Also, it provides effective use of the living space.

In the sound control system according to the present invention, the sound control device includes a sound collector, test signal transmitting means for transmitting test signals to the electronic devices via the communication network, and correction means for receiving test sounds produced from the speakers with the sound collector in response to the test signals, for analyzing the received sound signal, and for adjusting the output balance of the audio signals to the electronic devices.

A method for controlling sound in the sound control system according to the present invention includes: a test sound production step of transmitting the test signals to the electronic devices by the test signal transmitting means and producing test sound from the speakers of the electronic devices, and a correction step of receiving the test sound from the sound collector, analyzing the received sound signals, and adjusting the output balance of the audio signals to the electronic devices.

In a sound control system, a sound control device, and a method for controlling sound according to the present invention, through the test sound production step and the correction step, the sound control device can output to each electronic device sound signals having adjusted output balance based on test signals from the sound collector, thereby providing the best sound corresponding to the locations of the speakers based on the condition of received test signals. In particular, if the audio signal is a surround signal, sound having a surround effect is provided. That is, by simply placing the sound collector at the listener's location, sound having the listener's favorite surround effect is easily obtained in accordance with the number of electronic devices and their locations. In addition, the electronic devices can be located freely.

In a sound control system according to the present invention, the communication network includes a wireless communication network.

In a sound control system according to the present invention, the communication network includes a wireless LAN or a Bluetooth network, which eliminates wiring between the sound control device and each electronic device. Consequently, troublesome cabling work is not necessary and the appearance of the room is improved by eliminating cable clutter.

In a sound control system according to the present invention, the communication network includes a power line communication network.

In a sound control system according to the present invention, the communication network includes a power line communication (PLC) network, thus eliminating a cable connection between the sound control device and each electronic device. Consequently, troublesome cabling work is not necessary and the appearance of the room is improved by eliminating cable clutter.

In addition, since existing power lines are used for the communication, even if blocking objects exist between the sound control device and each electronic device, the communication is reliably performed as long as they are connected by the power lines. Thus, the sound control device and each electronic device can be placed without considering the blocking objects. For example, they can be placed in different rooms. This provides more freedom for locating the sound control device and the electronic devices.

The sound control system according to the present invention includes a lighting apparatus connected to the communication network, wherein the sound control device is capable of transmitting a light signal for changing the illumination light of the lighting apparatus via the communication network. The lighting apparatus includes light-signal receiving means for receiving the light signal via the communication network and light control means for changing at least one of the intensity and the color of the illumination light in response to the light signal.

Additionally, in the sound control device according to the present invention, the sound control device is capable of transmitting a light signal for changing the intensity of the illumination light of a lighting apparatus via the communication network and the light signal changes at least one of the intensity and the color of the illumination light.

In the sound control system and the sound control device according to the present invention, the lighting apparatus changes at least one of the intensity and the color of the illumination light in response to the light signal from the sound control device. Accordingly, the sound control device can control the intensity of the illumination light in synchronization with sound from speakers of the electronic devices. As a result, the light, for example, can be dimmed in accordance with the music or flashed in accordance with the movie scenes, thus providing a more realistic atmosphere to the listener.

DESCRIPTION OF THE PREFERRED EMBODIMENTS

Figure 1:
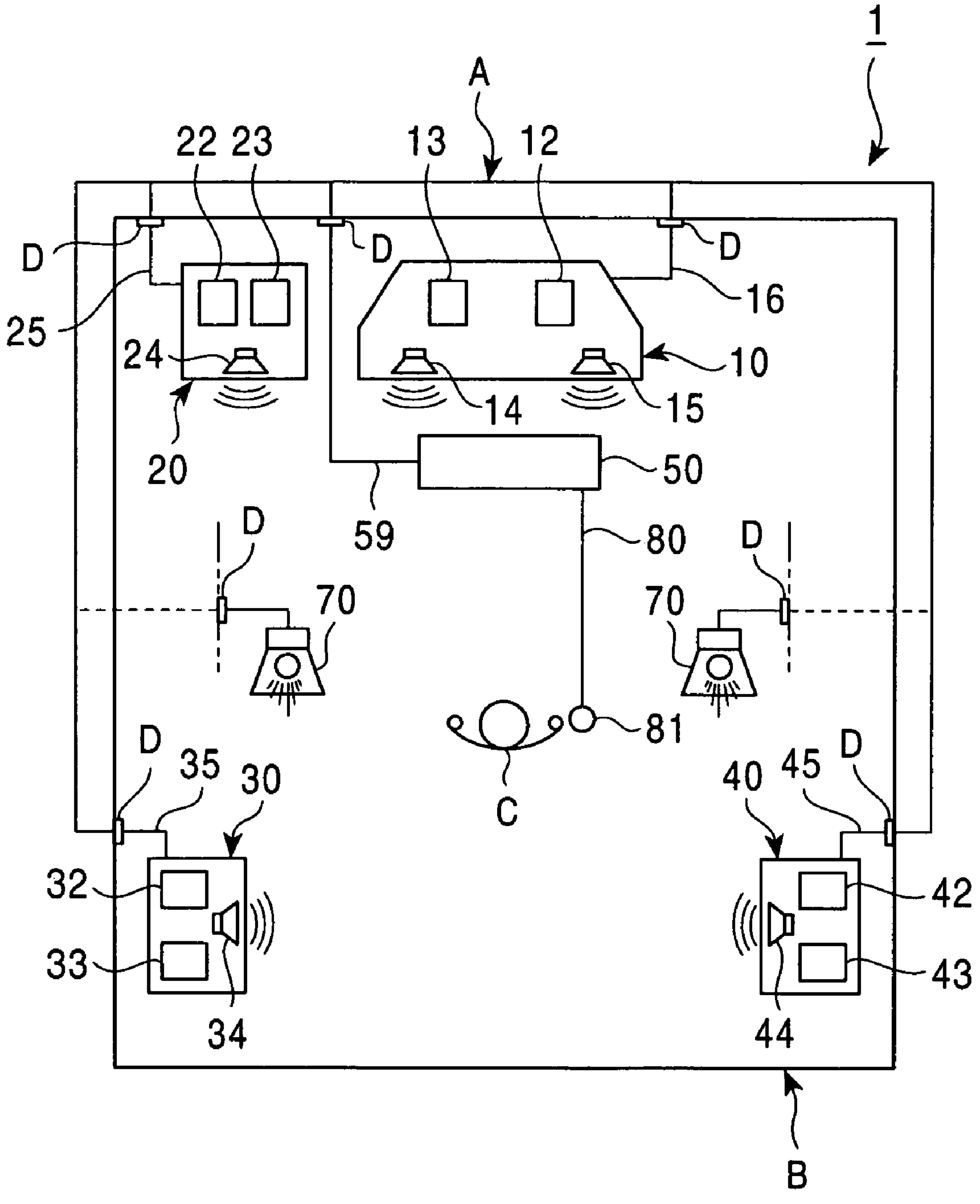
FIG. 1 illustrates the arrangement of a surround sound system in a listening room according to an embodiment of the present invention.

Embodiments according to the present invention will now be described with reference to FIGS. 1 to 4. A surround system 1 (a sound control system) shown in FIGS. 1 to 4 includes electronic devices 10, 20, 30, and 40, which are connected to a power line communication network A and can independently produce audio from connected or built-in speakers, and a sound control device 50, which transmits control signals that identify and control the electronic devices 10, 20, 30, and 40, and audio signals that correspond to the speakers of the electronic devices 10, 20, 30, and 40 via the power line communication network A. For example, the electronic devices 10, 20, 30, and 40 are a TV set 10, a Mini-Disc audio component system (hereinafter referred to as "MD component system") 20, a personal computer 30, and a radio 40, respectively.

The electronic devices 10, 20, 30, and 40 include power line communication modems (receiving means) 12, 22, 32, and 42 that can receive the control signals and audio signals via the power line communication network A, and selectors (switching means) 13, 23, 33, and 43 that drive the respective speakers by passing only the audio signals to the speakers.

In addition, the surround system 1 includes ceiling lighting units (lighting apparatuses) 70 connected to the power line communication network A. The sound control device 50 can transmit light signals to change the illumination of the ceiling lighting units 70 via the power line communication network A. Each ceiling lighting unit 70 includes a power line communication modem (light signal receiving means) 72, which can receive the light signal via the power line communication network A, and a light controller (light changing means) 73 that changes at least one of the intensity and the color of the illumination light.

With reference to FIG. 1, the sound control device 50, the TV set 10, and the MD component system 20 are placed in front of a listener C in a room B, while the personal computer 30 and the radio 40 are located at the left rear and the right rear of the listener C in the room B. Two ceiling lighting units 70 are mounted on the ceiling of the room B.

Figure 2:
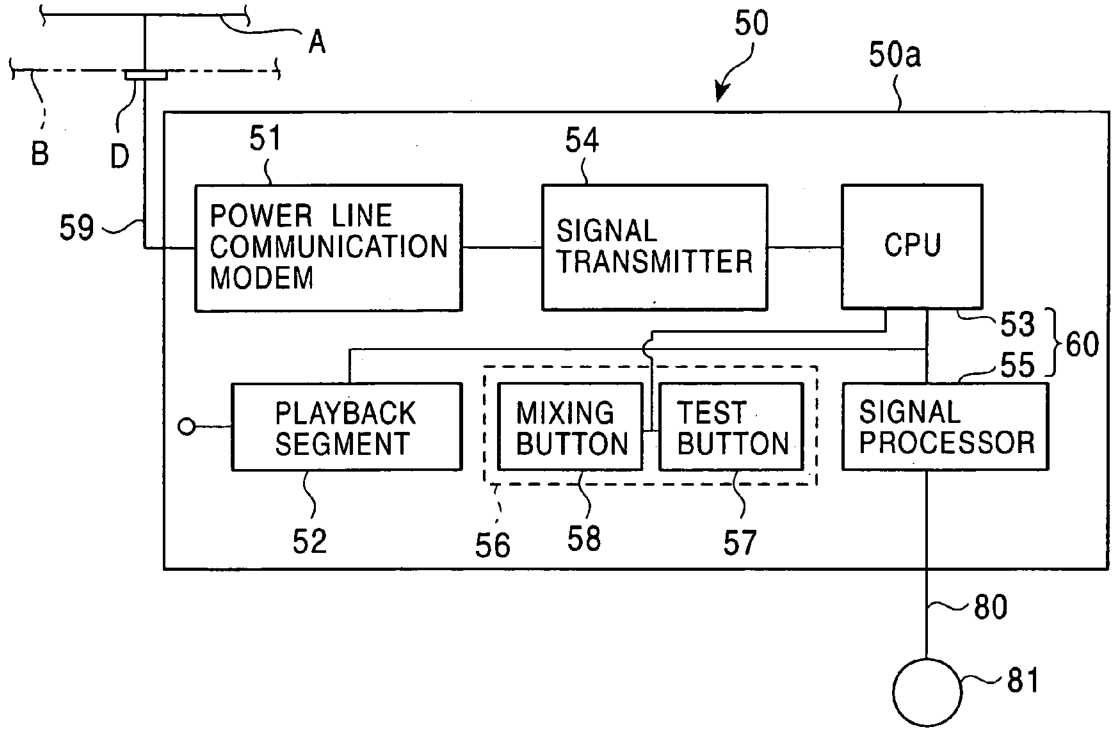
FIG. 2 is a block diagram of an audio control device in the surround sound system according to the embodiment of the present invention.

With reference to FIG. 2, a casing 50*a* of the sound control device 50 contains a power line communication modem 51, a playback segment 52, a central processing unit (CPU) 53, a signal transmitter (transmitting means or test signal transmitting means) 54, and a signal processor 55. Also, the casing 50*a* has an operation panel 56. A test button 57, a mixing button 58, and other operation buttons (not shown) are arranged on the operation panel 56. A directional microphone (sound collector) 81 is connected to the signal processor 55 via a cable 80.

The sound control device 50 is connected to the power line communication network A through a power outlet D on a wall of the room B with a power cable 59.

The power line communication modem 51 performs data communication of audio signals and other kinds of signal with each power line communication modem of the TV set 10, the MD component system 20, the personal computer 30, the radio 40, or the ceiling lighting units 70, which are discussed below, via the power cable 59, the power outlet D, and the power line communication network A. The power line communication modem 51 identifies the electronic devices 10, 20, 30, 40, and the ceiling lighting units 70 by communicating with the corresponding power line communication modems. Thus, the sound control device 50 is connected to the electronic devices 10, 20, 30, 40, and the ceiling lighting units 70 via the power line communication network A. The audio signal includes a main signal and a surround sound signal for producing sound having a surround effect.

The playback segment 52 plays back digital audio data from an audio/video playback unit (not shown), such as a digital versatile disk or digital video disk (DVD) player, to produce audio signals, which are output to the CPU 53. The CPU 53 outputs the audio signals and a control signal to the signal transmitter 54. Additionally, the CPU 53 transmits a test signal and a light signal to the signal transmitter 54 when the test button 57 and the mixing button 58 are depressed, respectively. Thus, the CPU 53 can appropriately transmit the audio signal, the control signal, the test signal, and the light signal to the signal transmitter 54 based on the input information. Moreover, the signal transmitter 54 can transmit the signals from the CPU 53 to a specific electronic device, for example, the TV set 10.

The directional microphone 81 collects the test sounds from the speakers of the electronic devices 10, 20, 30, 40, and converts them to audio signals, then outputs the audio signals to the signal processor 55 via the cable 80. The signal processor 55 analyzes the audio signals from the directional microphone 81 and outputs them to the CPU 53. Additionally, in cooperation with the CPU 53, the signal processor 55 adjusts the output balance of the audio signals from the playback segment 52 based on the analysis. That is, the signal processor 55 and the CPU 53 function as correction means 60 to adjust the output balance of the audio signals transmitted to the electronic devices 10, 20, 30, and 40 based on the analysis of the input audio signals.

Figure 3:
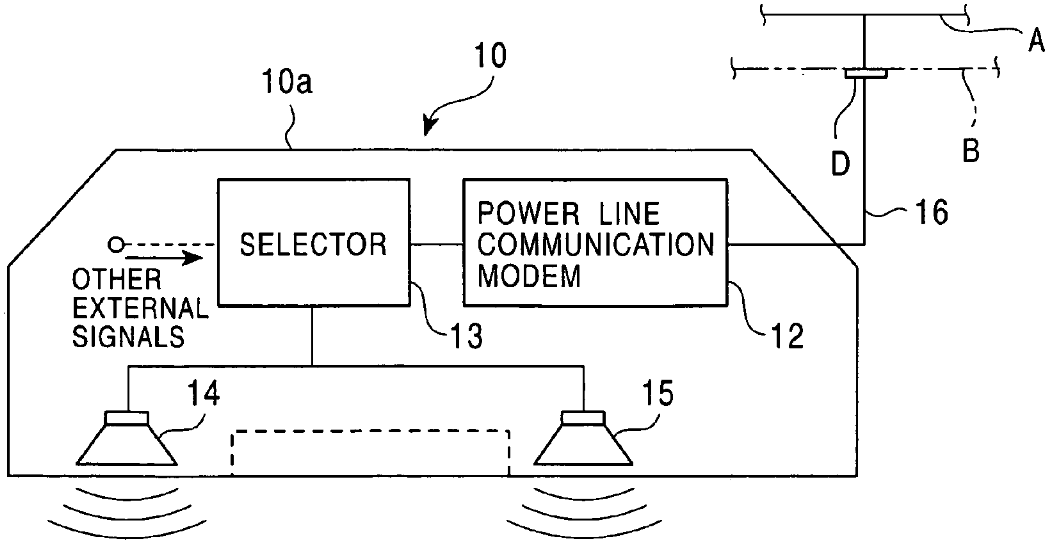
FIG. 3 is a block diagram of a TV set in the surround sound system according to the embodiment of the present invention.

With reference to FIG. 3, the TV set 10 is an electronic device that can independently produce sound from built-in speakers 14 and 15. A casing 10*a* contains a power line communication modem 12, a selector 13, and the speakers 14 and 15. In addition, the TV set 10 is connected to another power outlet D on the wall of the room B with a power cable 16, thereby allowing the power line communication modem 12 to communicate with the power line communication modem 51 in the sound control device 50 via the power cable 16, the power outlet D, and the power line communication network A. Note that a video image display section of the TV set 10 is not shown in FIG. 3.

The power line communication modem 12 can receive the control signal, the audio signal, and the test signal from the sound control device 50 via the power line communication network A. The selector 13, upon receipt of a control signal from the power line communication modem 12, switches from other external signals to the audio signal, thus outputting only the audio signal to the speakers 14 and 15 to drive them. That is, the selector 13 switches off other audio signal lines, for example, terrestrial broadcasting to the TV set 10, and receives only the audio signals from the sound control device 50 to produce sounds from the speakers 14 and 15. In addition, the selector 13, upon receipt of the test signal from the power line communication modem 12, allows the test signal to produce a test sound from the speakers 14 and 15.

The MD component system 20, the personal computer 30, and the radio 40 shown in FIG. 1 include the power line communication modems 22, 32, and 42, the selectors 23, 33, and 43, and speakers 24, 34, and 44, respectively, as in the TV set 10. The MD component system 20, the personal computer 30, and the radio 40 are connected to the power line communication network A through power outlets D on the wall of the room B with power cables 25, 35, and 45, respectively.

Figure 4:
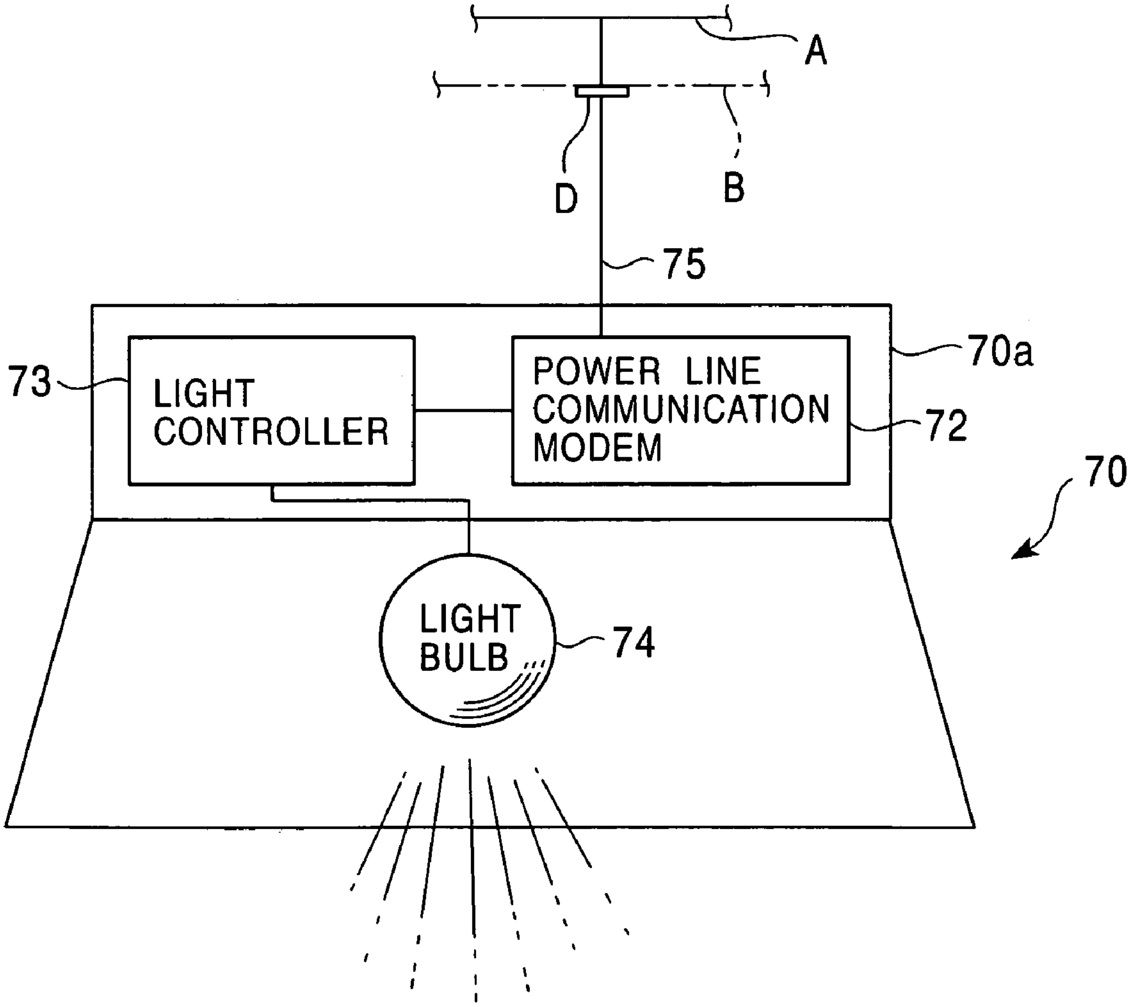
FIG. 4 is a block diagram of a ceiling lighting unit in the surround sound system according to the embodiment of the present invention.

With reference to FIG. 4, a casing 70*a* of the ceiling lighting unit 70 includes a power line communication modem 72, a light controller 73, and a light bulb 74. The ceiling lighting unit 70 is connected to a power outlet D on the ceiling of the room B with a power cable 75. Thus, the power line communication modems 72 can communicate with the power line communication modem 51 in the sound control device 50 via the power cables 75, the power outlets D, and the power line communication network A. Additionally, the power line communication modems 72 can receive a light signal from the sound control device 50 via the power line communication network A. The light controllers 73 change the intensity of light of the light bulbs 74 in response to the light signal from the power line communication modems 72.

In this surround system 1, when a user enjoys software including sound, such as music or movies, using an audio/video playback unit, such as a DVD player (not shown), the sound control device 50, the TV set 10, the MD component system 20, the personal computer 30, and the radio 40 are powered on. When the sound control device 50 is powered on, the power line communication modem 12 communicates with the power line communication modems 12, 22, 32, and 42 of the electronic devices 10, 20, 30, and 40, respectively, to identify them, and then transmits control signals from the signal transmitter 54 to them. In response to the control signals, the selectors 13, 23, 33, and 43 of the electronic devices 10, 20, 30, and 40 are switched to output only audio signals from the sound control device 50 to the speakers 14, 15, 24, 34, and 44.

Subsequently, the directional microphone 81 is placed at the listener's position, and the test button 57 on the operation panel 56 of the sound control device 50 is depressed. The CPU 53 transmits a test signal to the signal transmitter 54.

The signal transmitter 54 outputs the test signals to the TV set 10, the MD component system 20, the personal computer 30, and the radio 40 via the power line communication network A. In this case, the CPU 53 and the signal transmitter 54 sequentially transmit the test signals to, for example, in turn, the TV set 10, the MD component system 20, the personal computer 30, and the radio 40 at predetermined time intervals. The test signals are output as test sounds from the speakers 14, 15, 24, 34, and 44 of the electronic devices 10, 20, 30, and 40. The test sounds are sequentially collected by the directional microphone 81 and converted to audio signals, which are input to the signal processor 55 of the sound control device 50.

After the test sound collecting process, the signal processor 55 analyzes the input audio signals. For example, the signal processor 55 analyzes the directions, the volumes, and the qualities of the test sounds, and the arrival times from the sound sources to the directional microphone 81, and memorizes the most suitable audio signal output values for the electronic devices 10, 20, 30, and 40 to achieve the best surround effect at the location of the directional microphone 81. In this case, for example, main signals are preset to be transmitted to the TV set 10 and the MD component system 20, which are placed in front of the listener C, and surround signals producing the surround effect are preset to be transmitted to the personal computer 30 and the radio 40, which are placed at the left rear and the right rear of the listener C. Then, the completion of the test is notified to the listener C by displaying a message (not shown) on the operation panel 56.

Subsequently, the listener C plays back software, such as classical music video, using an audio/video playback unit, such as a DVD player. The played back audio signal is input to the CPU 53 via the playback segment 52 in the sound control device 50 and the output balance of the audio signal is adjusted to be identical to the above-described memorized output value. After the correction process, the audio signal is transmitted from the signal transmitter 54 to the electronic devices 10, 20, 30, and 40 via the power line communication network A. That is, the main signal is transmitted to the speakers 14, 15, and 24 of the TV set 10 and the MD component system 20 and the surround signal is transmitted to the speakers 34 and 34 of the personal computer 30 and the radio 40. Accordingly, the listener C can enjoy classical music with a surround-sound effect in which, for example, the volume, the quality, and the timing of the sound are modified by the front speakers 14, 15, and 24 and the rear speakers 34 and 44.

If software, such as music videos and movie videos for an audio/video playback unit including a DVD player, contains a signal that controls a lighting effect, depressing the mixing button 58 on the operation panel 56 of the sound control device 50 causes the CPU 53 to transmit the light signal corresponding to the surround signal to the signal transmitter 54. The signal transmitter 54 then transmits the light signal to the ceiling lighting units 70. The light signal is received by the power line communication modems 72 to start the light controllers 73. The light controllers 73 change the intensity of light of the light bulbs 74 depending on the light signal transmitted from the sound control device 50. As a result, the listener C can enjoy the mood of the classical music by darkening and brightening the room B in accordance with the music while listening to sound having a surround effect.

Additionally, by operating a mode selection switch (not shown) on the operation panel 56 of the sound control device 50, the CPU 53 further adjusts the output balance of the surround signal. For example, a concert mode allows the listener C to listen to classical music with a superior surround effect, like a concert hall, produced by the TV set 10, the MD component system 20, the personal computer 30, and the radio 40. When an audio/video playback unit, such as a DVD player, plays back software such as a movie video and a movie mode is selected, the listener C can enjoy both sound and visual light effects with the presence in the movie by darkening and brightening the ceiling lighting units 70 in accordance with the movie scenes.

When the surround system 1 is unused, the sound control device 50 is powered off so that the control signals from the signal transmitter 54 are blocked. The selectors 13, 23, 33, and 43 of the electronic devices 10, 20, 30, and 40 return to the initial positions. As a result, the TV set 10, the MD component system 20, the personal computer 30, and the radio 40 can be used as stand-alone electronic devices.

According to the surround system 1, the connected or built-in speakers of the electronic devices 10, 20, 30, and 40, which can independently produce sounds, can provide sound having a surround effect via the power line communication network A. As a result, the electronic devices including the TV set 10 can be versatile and cost-efficient, thus eliminating the need for dedicated speakers and providing low-lost audio systems having a surround effect. In addition, eliminating dedicated surround speakers provides effective use of living space in the room B and improves the appearance of the room B.

Additionally, the test sound using the directional microphone 81 facilitates the setting of the surround sound effect. For example, even if the TV set 10 and the MD component system 20 are relocated, re-setting of the surround sound effect is easy, thereby increasing the flexibility of locating the electronic devices 10, 20, 30, and 40.

The sound control device 50 and each of the electronic devices 10, 20, 30, and 40 are connected via the power line communication network A, thereby eliminating work required for wiring and improving the appearance of the room B by eliminating cable clutter. Furthermore, the power line communication network A is not affected by blocking objects, thereby providing reliable communication.

The present invention is not limited to the above-discussed embodiment; many changes and modifications can be made without departing from the spirit and scope of the invention.

Although a TV set, a MD component system, a personal computer, and a radio are used as electronic devices in the above-discussed embodiment, the electronic devices are not limited thereto. They may be other electronic devices that can independently produce sounds from their connected speakers. Alternatively, a single electronic device may be used.

In the above-discussed embodiment, three speakers are placed in front of a listener, two speakers are placed behind the listener, and the surround sound signals are transmitted to the rear speakers as in the 5.1 channel surround systems; however, the configuration is not limited thereto. For example, only audio signals may be transmitted to all the speakers.

Although a power line communication network is used as the communication network, a wireless communication network may be used. For example, a wireless LAN or a Bluetooth network may be used. In this case, a sound control device and each electronic device may include a dedicated modem and an antenna for transmission and reception. Also, the network may be a wireless communication network using infrared (IR) communication.

Further, although sound is played back by an audio/video playback unit, such as a DVD player, music may be downloaded via the Internet using, for example, a personal computer connected to the power line communication network. In this case, the downloaded music data may be transmitted to the sound control device via the power line communication network and played back to produce audio signals by the sound control device.

What is claimed is:

1. A sound control system comprising:

a plurality of electronic devices connected to a communication network, each of the electronic devices being capable of independently producing sound from connected speakers; and a sound control device identifying the electronic devices, the sound control device transmitting control signals for controlling electronic devices and the sound control device transmitting the audio signals to the speakers to the electronic devices;

wherein each electronic device comprises receiving means for receiving the control signals and the audio signals via the communication network and selecting in for switching from other external signals to the audio signals in response to the control signals in order to drive the speakers by only the audio signals output to the speakers, and wherein the communication network includes a power line communication network, and wherein the sound control device comprises a sound collector, test signal transmitting means for transmitting test signals to the electronic devices via the communication network, and correction means for receiving test sounds produced from the sneakers with sound collector in response to the test signals, for analyzing the received sound signal, and for adjusting the output balance of the audio signals to the electronic devices.

2. A sound control system according to claim 1, wherein the audio signals include surround sound signals.

3. A sound control system according to one of claim 1 to 2, wherein the communication network includes a wireless communication network.

4. A sound control system according to claim 1, wherein the electronic devices include at least two of a television set, a Mini-Disc (MD) audio component, a personal computer, and a radio set.

5. A sound control system comprising:

a plurality of electronic devices connected to a communication network, each of the electronic devices being capable of independently producing sound from connected speakers;

a sound control device identifying the electronic devices, the sound control device transmitting control signals for controlling the electronic devices and the sound control device transmitting the audio signals to the speakers to the electronic devices; and a lighting apparatus connected to the communication network, wherein each electronic device comprises receiving means for receiving the control signals and the audio signals via the communication network and selecting means for switching from other external signals to the audio signals in response to the control signals in order to drive the speakers by only the audio signals output to the speakers, wherein the sound control device is capable of transmitting a light signal for changing the illumination light of the lighting apparatus via the communication network, and the lighting apparatus comprises light-signal receiving means for receiving the light signal via the communication network and light control means for changing at least one of the intensity and the color of the illumination light in response to the light signal, and wherein the sound control device comprises a sound collector test signal transmitting means for transmitting test signals to the electronic devices via the communication network, and correction means for receiving test sounds produced from the speakers with the sound collector in response to the test signals, for analyzing the received sound signal, and for adjusting the output balance of the audio signals to the electronic devices.

6. A sound control device comprising transmitting means connected via a communication network to a plurality of electronic devices capable of independently producing sounds from connected speakers, the transmitting means being capable of identifying the electronic devices and transmitting control signals for controlling the electronic devices and the sound control device transmitting the audio signals to the speakers to the electronic devices, wherein the control signals includes at least signals for switching from other external signals to the audio signals in order to drive the speakers by only the audio signals output to the speakers, a sound collector test signal transmitting means for transmitting test signals to the electronic devices via the communication network; and correction means for receiving test sounds from the speakers with the collector in response to the test signals, analyzing the received sound signal, and adjusting the output balance of the audio signals to the electronic devices, wherein the sound control device is capable of transmitting a light signal for changing the illumination light of a lighting apparatus via the communication network, an the light signal changes at least one of the intensity and the color of the illumination light.

* * * * *